United States Patent
Liao et al.

(10) Patent No.: US 7,701,284 B2
(45) Date of Patent: Apr. 20, 2010

(54) LINE DRIVER CAPABLE OF AUTOMATICALLY ADJUSTING OUTPUT IMPEDANCE

(75) Inventors: Su-Liang Liao, Jhubei (TW); Ming-Cheng Chiang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 92 days.

(21) Appl. No.: 12/167,408

(22) Filed: Jul. 3, 2008

(65) Prior Publication Data
US 2009/0009242 A1    Jan. 8, 2009

(30) Foreign Application Priority Data
Jul. 6, 2007    (TW)    ............... 96124752 A

(51) Int. Cl.
*H03F 3/45* (2006.01)
*H03F 1/34* (2006.01)

(52) U.S. Cl. .................... 330/69; 330/86; 330/104
(58) Field of Classification Search ........... 330/69, 330/86, 103, 104, 282
See application file for complete search history.

(56) References Cited
U.S. PATENT DOCUMENTS

| | | | | |
|---|---|---|---|---|
| 3,209,277 A * | 9/1965 | Burwen | ............... | 330/69 |
| 5,034,699 A * | 7/1991 | Powell | ............... | 330/86 |
| 5,168,397 A * | 12/1992 | Iwamura et al. | ............... | 360/67 |
| 6,359,505 B1 * | 3/2002 | Joffe | ............... | 330/69 |
| 6,600,366 B2 * | 7/2003 | Ferianz | ............... | 330/69 |

* cited by examiner

*Primary Examiner*—Steven J Mottola
(74) *Attorney, Agent, or Firm*—Stephen A. Bent; Foley & Lardner LLP

(57) ABSTRACT

A line driver includes: a differential amplifier for amplifying an input signal to generate an output signal; first and second series resistors coupled respectively to output terminals of the differential amplifier and through which the output signal is output; first and second negative-feedback resistors each coupled between a respective input terminal and a respective output terminal of the differential amplifier; first and second positive-feedback variable resistors each coupled between a respective input terminal of the differential amplifier and a respective one of the first and second series resistors; and an adjusting unit coupled to the first and second positive-feedback variable resistors to adjust a resistance thereof with reference to the output signal.

20 Claims, 3 Drawing Sheets

LINE DRIVER CAPABLE OF AUTOMATICALLY ADJUSTING OUTPUT IMPEDANCE

CROSS-REFERENCE TO RELATED APPLICATION

This application claims priority of Taiwanese Application No. 096124752, filed on Jul. 6, 2007.

BACKGROUND OF THE INVENTION

1. Field of the Invention

The present invention relates to a line driver, more particularly to a line driver that is capable of automatically adjusting an output impedance.

2. Description of the Related Art

A transmission line is used to transmit high-speed signals, and a line driver is used to drive the input to the transmission line with a higher than normal signal level. However, in order to reduce signal reflection, an output impedance of the line driver must be matched with a characteristic impedance of the transmission line.

FIG. 1 shows a conventional active terminal line driver which forms a part of an integrated circuit (not shown). The line driver is coupled to a load 18 that has a resistance ($R_1$). The line driver is used to amplify an input current ($I_{in}$) to produce an output voltage for driving the load 18. The line driver comprises a differential amplifier 11, a pair of series variable resistors 12, 13, a pair of negative-feedback resistors 14, 15, and a pair of positive-feedback resistors 16, 17. Each of the series variable resistors 12, 13 includes a plurality of resistor elements (not shown), and a plurality of switches (not shown) that are controlled to vary coupling states of the resistor elements and thereby change a resistance of the respective series variable resistor 12, 13.

Referring to FIG. 2, an equivalent half circuit of the line driver may be constructed to determine an output impedance ($Z_{out}$) and a transimpedance ($1/G_m$) thereof as follows:

$$Z_{out} = \frac{V_{out}}{I_{out}} = \frac{R_s}{1 - \frac{R_f}{R_p} + \frac{R_s}{R_p}} \cong \frac{R_s}{1 - \frac{R_f}{R_p}} \quad (\text{when } R_p \gg R_s)$$

$$\frac{1}{G_m} = \frac{V_{out}}{I_{in}} = \frac{R_f}{1 + \frac{R_s}{R_l // R_p} - \frac{R_f}{R_p}} \cong \frac{R_f}{1 + \frac{R_s}{R_l} - \frac{R_f}{R_p}} \quad (\text{when } R_p \gg R_1)$$

where ($V_{out}$) is an amplitude of the output voltage, ($R_s$) is a resistance of each of the series variable resistors 12, 13, ($R_f$) is a resistance of each of the negative-feedback resistors 14, 15, ($R_p$) is a resistance of each of the positive-feedback resistors 16, 17, and ($R_1$) is the resistance of the load 18.

Therefore, the amplitude ($V_{out}$) of the output voltage is as follows:

$$V_{out} = I_{in} \times \frac{R_f}{1 + \frac{R_s}{R_l} - \frac{R_f}{R_p}}.$$

Due to manufacturing variations in the integrated circuit (variation ratios of the resistors 12-17 are substantially the same, that is, ±20%), the output impedance ($Z_{out}$) and the transimpedance ($1/G_m$) will be varied correspondingly, and the output impedance ($Z_{out}$) is approximately directly proportional to the resistance ($R_s$) of each of the series variable resistors 12, 13.

The conventional technique of correcting the output impedance ($Z_{out}$) so that it corresponds to its design value involves adjusting the resistance ($R_s$) of each of the series variable resistors 12, 13. Also, in order to fix the amplitude ($V_{out}$) of the output voltage, the conventional technique involves generating the input current ($I_{in}$) (the input current $I_{in}$ may be affected by manufacturing variations) with reference to an internal resistor (not shown) of the integrated circuit so as to counterbalance a variation in the transimpedance ($1/G_m$).

Since correction using conventional techniques entails utilizing equations of the output impedance ($Z_{out}$) and the amplitude ($V_{out}$) of the output voltage after having undergone simplification, the output impedance ($Z_{out}$) and the amplitude ($V_{out}$) of the output voltage will still be varied from their intended values.

In addition, since the resistance ($R_s$) of each of the series variable resistors 12, 13 is extremely small (typically a few tens of ohms), the switches for the series variable resistors 12, 13 must be very large so as to reduce conduction resistances of the same. More space is required to implement such large switches. Also, conduction resistances of the switches may be influenced by the output voltage and thereby reduce the linearity of the output voltage.

SUMMARY OF THE INVENTION

Therefore, the object of this invention is to provide a line driver that can overcome the aforementioned drawbacks of the prior art.

The line driver of this invention comprises: a differential amplifier for amplifying an input signal to generate an output signal, the differential amplifier including an inverting input terminal, a non-inverting input terminal, an inverting output terminal, and a non-inverting output terminal, the inverting input terminal and the non-inverting input terminal receiving the input signal; first and second series resistors, the first series resistor being coupled to the non-inverting output terminal of the differential amplifier, the second series resistor being coupled to the inverting output terminal of the differential amplifier, the output signal generated by the differential amplifier being output through the first and second series resistors; first and second negative-feedback resistors, the first negative-feedback resistor being coupled between the inverting input terminal and the non-inverting output terminal of the differential amplifier, the second negative-feedback resistor being coupled between the non-inverting input terminal and the inverting output terminal of the differential amplifier; first and second positive-feedback variable resistors, the first positive-feedback variable resistor being coupled between the inverting input terminal of the differential amplifier and the second series resistor, the second positive-feedback variable resistor being coupled between the non-inverting input terminal of the differential amplifier and the first series resistor; and an adjusting unit coupled to the first and second positive-feedback variable resistors, the adjusting unit adjusting a resistance of each of the first and second positive-feedback variable resistors with reference to the output signal.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
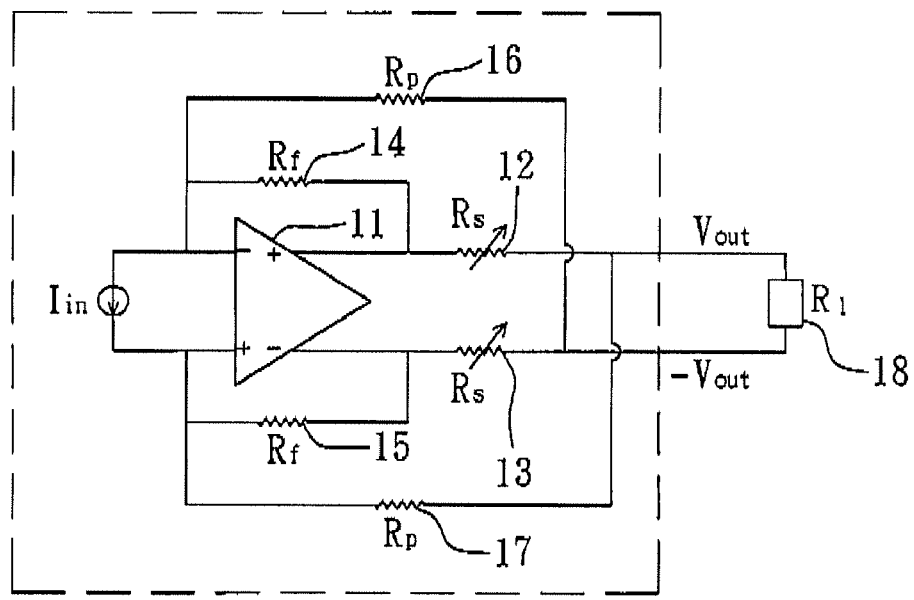
FIG. 1 is a schematic circuit diagram of a conventional active terminal line driver.
Figure 2:
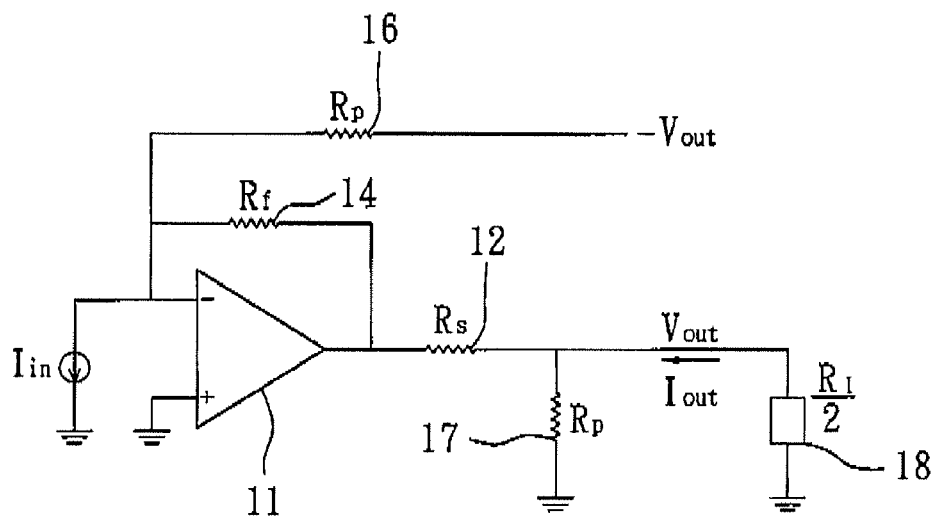
FIG. 2 is a schematic circuit diagram of an equivalent half circuit of the line driver of FIG. 1.
Figure 3:
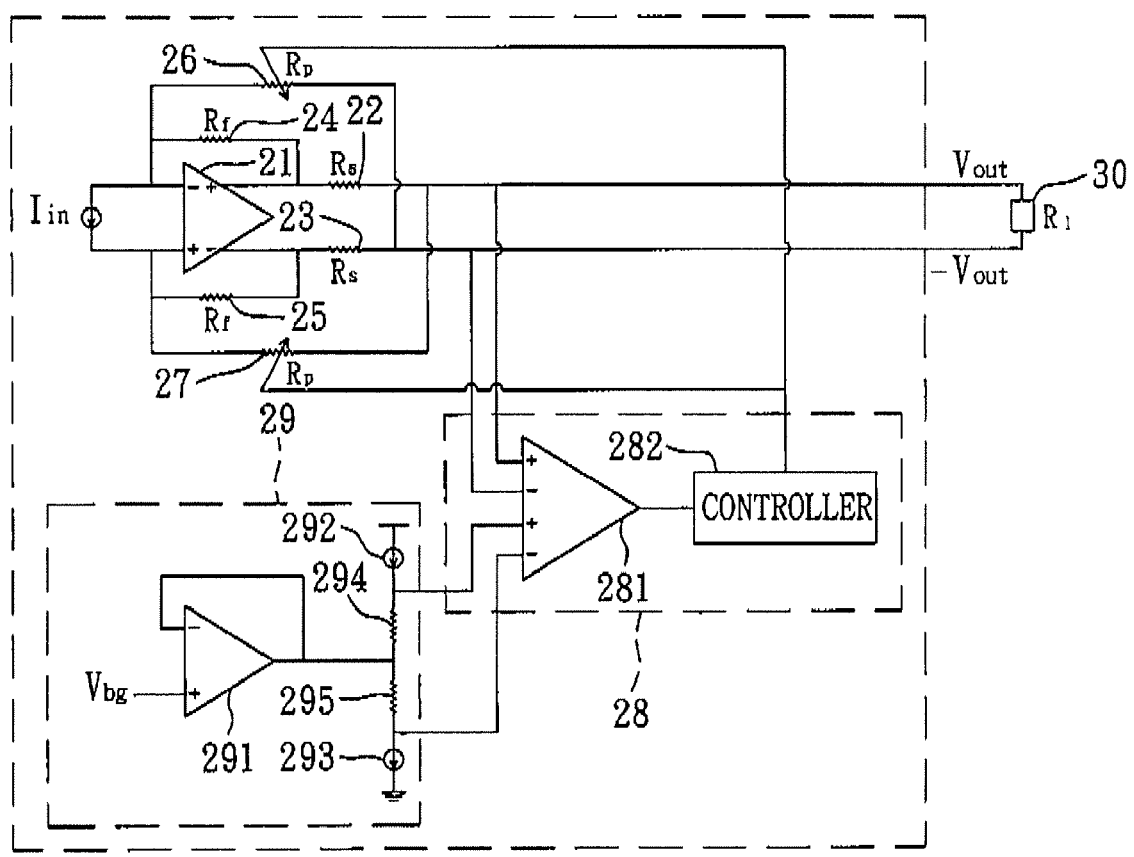
FIG. 3 is a schematic circuit diagram of a line driver according to a first preferred embodiment of the present invention.

Referring to FIG. 3, a line driver according to a first preferred embodiment of the present invention is adapted to form part of an integrated circuit (not shown), and is further adapted to be coupled to a load 30 that is external to the integrated circuit and that has a load resistance ($R_l$). The line driver of the first preferred embodiment comprises a differential amplifier 21, a series resistor unit including first and second series resistors 22, 23, a negative-feedback resistor unit including first and second negative-feedback resistors 24, 25, a positive-feedback variable resistor unit including first and second positive-feedback variable resistors 26, 27, and an adjusting unit 28. Each of the first and second positive-feedback variable resistors 26, 27 includes a plurality of resistor elements (not shown) and a plurality of switches (not shown). The switches may be controlled to vary coupling states of the resistor elements and thereby vary a resistance ($R_p$) of each of the first and second positive-feedback variable resistors 26, 27.

The differential amplifier 21 amplifies an input signal to generate an output signal for driving the load 30. Further, in the first preferred embodiment, the input signal is a current signal referred to hereinafter as an input current ($I_{in}$), and the output signal is an output voltage. In the first preferred embodiment, the input current ($I_{in}$) is generated with reference to a reference resistor (not shown) external to the integrated circuit, such that the input current (Tin) is not influenced by manufacturing variations in the integrated circuit. The differential amplifier 21 includes an inverting input terminal, a non-inverting input terminal, an inverting output terminal, and a non-inverting output terminal. The inverting input terminal and the non-inverting input terminal receive the input current ($I_{in}$).

The first series resistor 22 is coupled between the non-inverting output terminal of the differential amplifier 21 and a first terminal of the load 30, and the second series resistor 23 is coupled between the inverting output terminal of the differential amplifier 21 and a second terminal of the load 30. The output voltage generated by the differential amplifier 21 is output to the load 30 through the first and second series resistors 22, 23. In some embodiments, each of the first and second series resistors 22, 23 may be realized using a fixed resistor.

The first negative-feedback resistor 24 is coupled between the inverting input terminal and the non-inverting output terminal of the differential amplifier 21, and the second negative-feedback resistor 25 is coupled between the non-inverting input terminal and the inverting output terminal of the differential amplifier 21. In some embodiments, each of the first and second negative-feedback resistors 24, 25 may be realized using a fixed resistor.

The first positive-feedback variable resistor 26 is coupled between the inverting input terminal of the differential amplifier 21 and the second terminal of the load 30 (or stated differently, between the inverting input terminal of the differential amplifier 21 and a node between the second terminal of the load 30 and the second series resistor 23), and the second positive-feedback variable resistor 27 is coupled between the non-inverting input terminal of the differential amplifier 21 and the first terminal of the load 30 (or stated differently, between the non-inverting input terminal of the differential amplifier 21 and a node between the first terminal of the load 30 and the first series resistor 22).

The adjusting unit 28 is coupled to the first and second positive-feedback variable resistors 26, 27. The adjusting unit 28 adjusts the resistance ($R_p$) of each of the first and second positive-feedback variable resistors 26, 27 with reference to an amplitude ($V_{out}$) of the output voltage. Through such adjustment, a variation in the amplitude ($V_{out}$) of the output voltage is removed, and the output impedance ($Z_{out}$) of the line driver is adjusted, such that the output impedance ($Z_{out}$) is equivalent to line impedance.

Due to manufacturing variations in the integrated circuit, actual resistances ($R_{s\_real}$, $R_{f\_real}$, $R_{p\_real}$) of the resistors 22-27 may become (1+x)-times design resistances ($R_{s\_design}$, $R_{f\_design}$, $R_{p\_design}$) thereof. When the resistance ($R_p$) of each of the first and second positive-feedback variable resistors 26, 27 is varied so that it becomes (1+y)-times the actual resistance ($R_{p\_real}$) r in this embodiment, a design transimpedance ($1/G_{m\_design}$) and a calibrated transimpedance ($1/G_{m\_cal}$) of the transimpedance ($1/G_m$) are as shown below:

$$\frac{1}{G_{m\_design}} = \frac{R_{f\_design}}{1 + \frac{R_{s\_design}}{R_l // R_{p\_design}} - \frac{R_{f\_design}}{R_{p\_design}}},$$

$$\frac{1}{G_{m\_cal}} = \frac{R_{f\_design}(1+x)}{1 + \frac{R_{s\_design}(1+x)}{R_l // [R_{p\_design}(1+x)(1+y)]} - \frac{R_{f\_design}(1+x)}{R_{p\_design}(1+x)(1+y)}}.$$

In order to make the design transimpedance ($1/G_{m\_design}$) equal to the calibrated transimpedance ($1/G_{m\_cal}$), (y) must satisfy the following condition;

$$y = \frac{1}{1 + x \cdot \left(\frac{R_{p\_design}}{R_{s\_design} - R_{f\_design}} + 1\right)} - 1$$

At this time, since a variation in the transimpedance ($1/G_m$) is removed, and since the input current ($I_{in}$) is not influenced by manufacturing variations in the integrated circuit, the amplitude ($V_{out}$) of the output voltage is fixed.

When adjusting the resistance ($R_p$) of each of the first and second positive-feedback variable resistors 26, 27 to change the same into (1+z)-times the actual resistance ($R_{p\_real}$), the design impedance ($Z_{out\_design}$) and the calibrated impedance ($Z_{out\_cal}$) of the output impedance ($Z_{out}$) of this embodiment are as follows:

$$Z_{out\_design} = \frac{R_{s\_design}}{1 - \frac{R_{f\_design}}{R_{p\_design}} + \frac{R_{s\_design}}{R_{p\_design}}},$$

$$Z_{out\_cal} = \frac{R_{s\_design}(1+x)}{1 - \frac{R_{f\_design}(1+x)}{R_{p\_design}(1+x)(1+z)} + \frac{R_{s\_design}(1+x)}{R_{p\_design}(1+x)(1+z)}}$$

In order to make the design impedance ($Z_{out\_design}$) and the calibrated impedance ($Z_{out\_cal}$) of the output impedance ($Z_{out}$) equal, (z) must satisfy the following condition:

$$z = \frac{1}{1 + x \cdot \left( \frac{R_{p\_design}}{R_{s\_design} - R_{f\_design}} + 1 \right)} - 1.$$

Since the conditions for removing variations in the amplitude ($V_{out}$) of the output voltage and variations in the output impedance ($Z_{out}$) are the same, and since correction is not performed using equations that have undergone simplification, the adjusting unit 28 is used in this embodiment to correct the amplitude ($V_{out}$) of the output voltage and, at the same time, to correct the output impedance ($Z_{out}$), such that the amplitude ($V_{out}$) of the output voltage and the output impedance ($Z_{out}$) do not vary.

Additionally, since the resistance ($R_p$) of each of the first and second positive-feedback variable resistors 26, 27 is relatively large (for example, 5 kΩ), the switches used in the same may be relatively small to thereby reduce the overall size of the line driver. When the switches are coupled to the inverting input terminal and the non-inverting input terminal of the differential amplifier 21, conduction resistances of the switches are not influenced by the output voltage, such that a linearity of the output voltage may be enhanced.

In the first preferred embodiment, the adjusting unit 28 includes a comparator 281 and a controller 282. The comparator 281 compares the amplitude ($V_{out}$) of the output voltage with a reference amplitude, and outputs a comparison result. The controller 282 is coupled to the comparator 281 and to each of the first and second positive-feedback variable resistors 26, 27. The controller 282 adjusts the resistance ($R_p$) of each of the first and second positive-feedback variable resistors 26, 27 on the basis of the comparison result. In the first preferred embodiment, the controller 282 reduces the resistance ($R_p$) of each of the first and second positive-feedback variable resistors 26, 27 when the amplitude ($V_{out}$) of the output voltage is larger than the reference amplitude, and increases the resistance ($R_p$) of each of the first and second positive-feedback variable resistors 26, 27 when the amplitude ($V_{out}$) of is the output voltage is smaller than the reference amplitude.

The first preferred embodiment further includes a reference amplitude generating unit 29. The reference amplitude generating unit 29 includes a buffer 291, first and second current sources 292, 293, and first and second resistors 294, 295. The buffer 291 receives a reference voltage, and transfers the reference voltage as an output reference voltage through an output terminal thereof. In the first preferred embodiment, the reference voltage is a bandgap voltage ($V_{bg}$). The first current source 292 supplies a first current, and the second current source 293 supplies a second current. In one embodiment, the first current and the second current are produced with reference to an internal resistor (not shown) of the integrated circuit, in which case the first current and the second current may be influenced by manufacturing variations. The first resistor 294 is coupled between the output terminal of the buffer 291 and the first current source 292, and the second resistor 295 is coupled between the output terminal of the buffer 291 and the second current source 293. The reference amplitude is produced through the first and second resistors 294, 295 as a function of the first and second currents and the output reference voltage.

Figure 4:
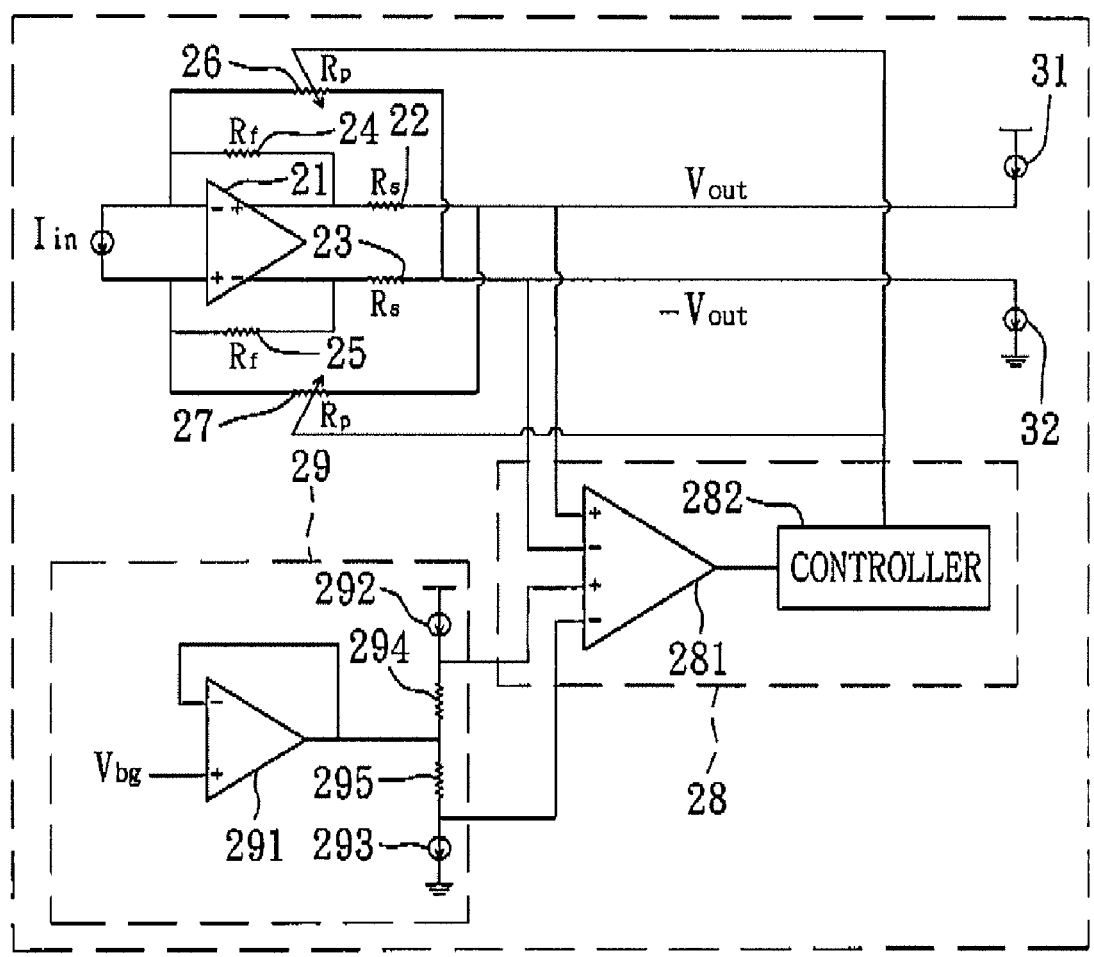
FIG. 4 is a schematic circuit diagram of a line driver according to a second preferred embodiment of the present invention.

FIG. 4 shows a line driver according to a second preferred embodiment of the present invention. In the second preferred embodiment, output terminals of the line driver are adapted to be coupled respectively to third and fourth current sources 31, 32 of the integrated circuit. In other words, the third and fourth current sources 31, 32 function as the load of the line driver. Compared with the first preferred embodiment, in the second preferred embodiment, the pins required for coupling with the load 30 (see FIG. 3) external of the integrated circuit may be omitted. All other aspects of the second preferred embodiment are substantially the same as the first preferred embodiment. For example, the second preferred embodiment likewise may realize automatic adjusting of output impedance and may be reduced in size, and the process of automatically adjusting the output impedance is identical to that in the first preferred embodiment.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A line driver, comprising:
  a differential amplifier for amplifying an input signal to generate an output signal, said differential amplifier including an inverting input terminal, a non-inverting input terminal, an inverting output terminal, and a non-inverting output terminal, said inverting input terminal and said non-inverting input terminal receiving the input signal;
  first and second series resistors, said first series resistor being coupled to said non-inverting output terminal of said differential amplifier, said second series resistor being coupled to said inverting output terminal of said differential amplifier, the output signal generated by said differential amplifier being output through said first and second series resistors;
  first and second negative-feedback resistors, said first negative-feedback resistor being coupled between said inverting input terminal and said non-inverting output terminal of said differential amplifier, said second negative-feedback resistor being coupled between said non-inverting input terminal and said inverting output terminal of said differential amplifier;
  first and second positive-feedback variable resistors, said first positive-feedback variable resistor being coupled between said inverting input terminal of said differential amplifier and said second series resistor, said second positive-feedback variable resistor being coupled between said non-inverting input terminal of said differential amplifier and said first series resistor; and
  an adjusting unit coupled to said first and second positive-feedback variable resistors, said adjusting unit adjusting a resistance of each of said first and second positive-feedback variable resistors with reference to the output signal.

2. The line driver of claim 1, wherein said adjusting unit includes:
a comparator for comparing an amplitude of the output signal with a reference amplitude, and outputting a comparison result; and
a controller coupled to said comparator and to each of said first and second positive-feedback variable resistors, said controller adjusting the resistance of each of said first and second positive-feedback variable resistors on the basis of the comparison result.

3. The line driver of claim 2, wherein said controller reduces the resistance of each of said first and second positive-feedback variable resistors when the amplitude of the output signal is larger than the reference amplitude, and increases the resistance of each of said first and second positive-feedback variable resistors when the amplitude of the output signal is smaller than the reference amplitude.

4. The line driver of claim 2, further comprising a reference amplitude generating unit including:
a buffer having an output terminal, said buffer transferring a reference voltage as an output reference voltage through said output terminal thereof;
a first current source supplying a first current;
a second current source supplying a second current;
a first resistor coupled between said output terminal of said buffer and said first current source; and
a second resistor coupled between said output terminal of said buffer and said second current source;
the reference amplitude being produced through said first and second resistors as a function of the first and second currents and the output reference voltage.

5. The line driver of claim 4, wherein the reference voltage is a bandgap voltage.

6. The line driver of claim 1, wherein said first and second series resistors are adapted to be coupled to a load.

7. The line driver of claim 1, wherein said line driver is adapted to form part of an integrated circuit, and said first and second series resistors are adapted to be coupled to a load that is external to the integrated circuit.

8. The line driver of claim 1, wherein said first series resistor is adapted to be coupled to a third current source, and said second series resistor is adapted to be coupled to a fourth current source.

9. The line driver of claim 1, wherein the input signal is a current signal.

10. The line driver of claim 1, wherein each of said first and second negative-feedback resistors is a fixed resistor.

11. A line driver, comprising:
a differential amplifier for amplifying an input signal to generate an output signal, said differential amplifier including an inverting input terminal, a non-inverting input terminal, an inverting output terminal, and a non-inverting output terminal;
a series resistor unit including
a first series resistor coupled to said non-inverting output terminal of said differential amplifier, and
a second series resistor coupled to said inverting output terminal of said differential amplifier,
the output signal generated by said differential amplifier being output through said first and second series resistors;

a negative-feedback resistor unit including
a first negative-feedback resistor coupled between said inverting input terminal and said non-inverting output terminal of said differential amplifier, and
a second negative-feedback resistor coupled between said non-inverting input terminal and said inverting output terminal of said differential amplifier;
a positive-feedback variable resistor unit including
a first positive-feedback variable resistor coupled between said inverting input terminal of said differential amplifier and said second series resistor, and
a second positive-feedback variable resistor coupled between said non-inverting input terminal of said differential amplifier and said first series resistor; and
an adjusting unit coupled to said positive-feedback variable resistor unit, and operable to adjust a resistance of said positive-feedback variable resistor unit.

12. The line driver of claim 11, wherein said adjusting unit includes:
a comparator for comparing an amplitude of the output signal with a reference amplitude, and outputting a comparison result; and
a controller coupled between said comparator and said positive-feedback variable resistor unit, said controller adjusting the resistance of said positive-feedback variable resistor unit on the basis of the comparison result.

13. The line driver of claim 12, wherein said controller reduces the resistance of said positive-feedback variable resistor unit when the amplitude of the output signal is larger than the reference amplitude, and increases the resistance of said positive-feedback variable resistor unit when the amplitude of the output signal is smaller than the reference amplitude.

14. The line driver of claim 12, further comprising a reference amplitude generating unit including:
a buffer having an output terminal, said buffer transferring a reference voltage as an output reference voltage through said output terminal thereof;
a first current source supplying a first current;
a second current source supplying a second current;
a first resistor coupled between said output terminal of said buffer and said first current source; and
a second resistor coupled between said output terminal of said buffer and said second current source;
the reference amplitude being produced through said first and second resistors as a function of the first and second currents and the output reference voltage.

15. The line driver of claim 14, wherein the reference voltage is a bandgap voltage.

16. The line driver of claim 11, wherein said series resistor unit is adapted to be coupled to a load.

17. The line driver of claim 11, wherein said line driver is adapted to form part of an integrated circuit, and said series resistor unit is adapted to be coupled to a load that is external to the integrated circuit.

18. The line driver of claim 11, wherein said first series resistor is adapted to be coupled to a third current source, and said second series resistor is adapted to be coupled to a fourth current source.

19. The line driver of claim 11, wherein the input signal is a current signal.

20. The line driver of claim 11, wherein each of said first and second negative-feedback resistors is a fixed resistor.

* * * * *